United States Patent
Arai et al.

(10) Patent No.: US 8,305,213 B2
(45) Date of Patent: Nov. 6, 2012

(54) FILM-LIKE ARTICLE AND METHOD FOR MANUFACTURING THE SAME

(75) Inventors: Yasuyuki Arai, Atsugi (JP); Mai Akiba, Isehara (JP); Yohei Kanno, Isehara (JP); Yuko Tachimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1108 days.

(21) Appl. No.: 10/586,049

(22) PCT Filed: Jan. 20, 2005

(86) PCT No.: PCT/JP2005/001040
§ 371 (c)(1),
(2), (4) Date: Jul. 14, 2006

(87) PCT Pub. No.: WO2005/071607
PCT Pub. Date: Aug. 4, 2005

(65) Prior Publication Data
US 2007/0159353 A1    Jul. 12, 2007

(30) Foreign Application Priority Data

Jan. 23, 2004  (JP) .................................. 2004-015537

(51) Int. Cl.
*G08B 13/14* (2006.01)
(52) U.S. Cl. ................. 340/572.1; 340/572.7; 340/572.8
(58) Field of Classification Search ............... 340/572.1, 340/572.2, 572.7, 572.8
See application file for complete search history.

(56) References Cited

U.S. PATENT DOCUMENTS

| | | | |
|---|---|---|---|
| 5,821,138 A | 10/1998 | Yamazaki et al. | |
| 5,847,931 A | 12/1998 | Gaumet et al. | |
| 6,222,452 B1 * | 4/2001 | Ahlstrom et al. | ......... 340/572.1 |

(Continued)

FOREIGN PATENT DOCUMENTS

CN        1213449        4/1999

(Continued)

OTHER PUBLICATIONS

International Search Report (Application No. PCT/JP2005/001040) dated May 31, 2005.

(Continued)

*Primary Examiner* — Daryl Pope
(74) *Attorney, Agent, or Firm* — Eric J. Robinson; Robinson Intellectual Property Law Office, P.C.

(57) ABSTRACT

Since the chip formed from a silicon wafer is thick, the chip is protruded from the surface or the chip is so large that it can be seen through the eyes, which affects the design of a business card or the like. Hence, it is an object of the present invention to provide a new integrated circuit which has a structure by which the design is not affected. In view of the above problems, it is a feature of the invention to equip a film-like article with a thin film integrated circuit. It is another feature of the invention that the IDF chip has a semiconductor film of 0.2 mm or less, as an active region. Therefore, the IDF chip can be made thinner as compared with a chip formed from a silicon wafer. In addition, such an integrated circuit can have light transmitting characteristic unlike a chip formed from a silicon wafer.

23 Claims, 12 Drawing Sheets

U.S. PATENT DOCUMENTS

| | | |
|---|---|---|
| 6,376,333 B1 | 4/2002 | Yamazaki et al. |
| 6,497,371 B2 * | 12/2002 | Kayanakis et al. ........... 235/492 |
| 6,509,217 B1 * | 1/2003 | Reddy ........................ 438/153 |
| 6,794,727 B2 | 9/2004 | Leduc et al. |
| 6,998,282 B1 | 2/2006 | Yamazaki et al. |
| 7,361,519 B2 | 4/2008 | Yamazaki et al. |
| 7,375,782 B2 | 5/2008 | Yamazaki et al. |
| 2002/0089049 A1 | 7/2002 | Leduc et al. |
| 2002/0094639 A1 * | 7/2002 | Reddy ........................ 438/257 |
| 2002/0127423 A1 | 9/2002 | Kayanakis |
| 2003/0022403 A1 | 1/2003 | Shimoda et al. |
| 2003/0025186 A1 | 2/2003 | Leduc et al. |
| 2005/0133790 A1 | 6/2005 | Kato |
| 2005/0134463 A1 | 6/2005 | Yamazaki |
| 2005/0135181 A1 | 6/2005 | Shionoiri et al. |
| 2005/0140495 A1 | 6/2005 | Yamazaki et al. |
| 2005/0141256 A1 | 6/2005 | Yamazaki et al. |
| 2005/0146006 A1 | 7/2005 | Yamazaki et al. |
| 2005/0148121 A1 | 7/2005 | Yamazaki et al. |
| 2006/0017659 A1 * | 1/2006 | Ogawa et al. ................... 345/30 |

FOREIGN PATENT DOCUMENTS

| | | |
|---|---|---|
| CN | 1329735 | 1/2002 |
| EP | 0 803 839 | 10/1997 |
| EP | 1 118 960 | 7/2001 |
| EP | 0 875 039 | 8/2001 |
| EP | 1 492 048 | 12/2004 |
| JP | 62-248692 A | 10/1987 |
| JP | 06-064379 A | 3/1994 |
| JP | 07-202147 A | 8/1995 |
| JP | 10-044660 | 2/1998 |
| JP | 11-020360 | 1/1999 |
| JP | 11-074198 A | 3/1999 |
| JP | 11-509024 | 8/1999 |
| JP | 2000-132657 A | 5/2000 |
| JP | 2001-044445 | 2/2001 |
| JP | 2001-155134 | 6/2001 |
| JP | 2002-008067 A | 1/2002 |
| JP | 2002-183693 | 6/2002 |
| JP | 2002-243929 A | 8/2002 |
| JP | 2003-211566 A | 7/2003 |
| JP | 2003-317059 | 11/2003 |
| JP | 2004-013649 | 1/2004 |
| WO | WO 97/26621 | 7/1997 |
| WO | WO 03/010825 | 2/2003 |
| WO | WO 2005/057658 | 6/2005 |
| WO | WO 2005/069204 | 7/2005 |

OTHER PUBLICATIONS

Written Opinion (Application No. PCT/JP2005/001040) dated May 31, 2005.

Partial International Search Report dated Mar. 8, 2005 for Application No. PCT/JP2005/001040.

Chinese Office Action (Application No. 200580002953.0) Dated Jun. 2, 2011.

Korean Office Action (Application No. 2006-7015596) Dated Mar. 14, 2011.

* cited by examiner

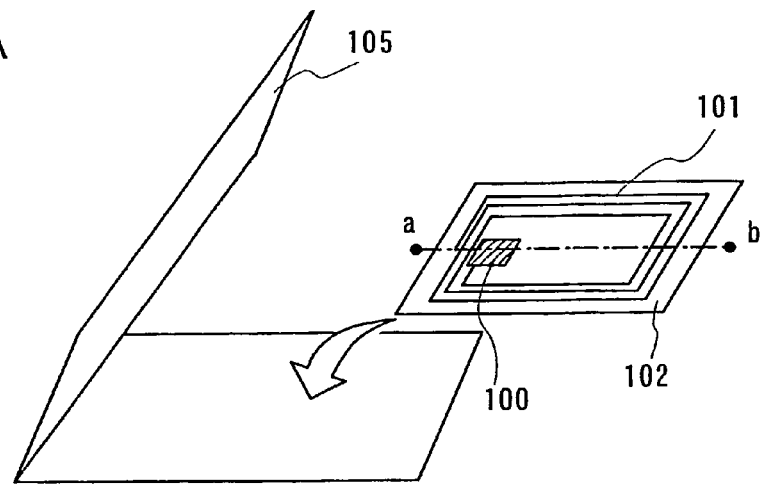
FIG. 1A
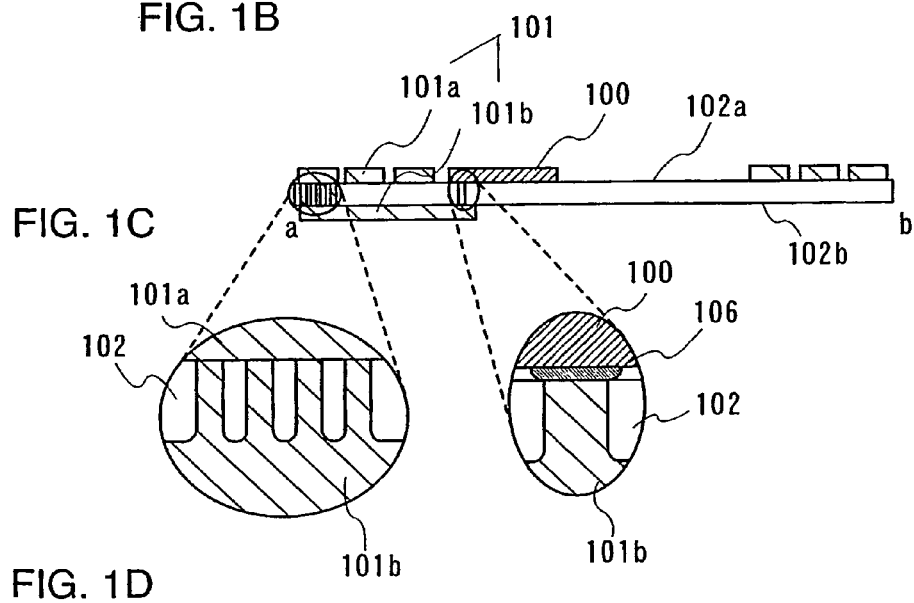
FIG. 1B
FIG. 1C
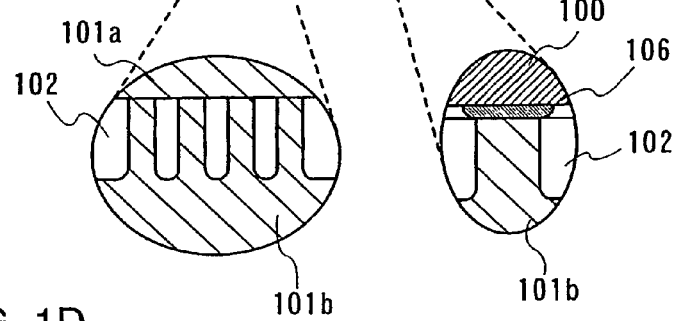
FIG. 1D
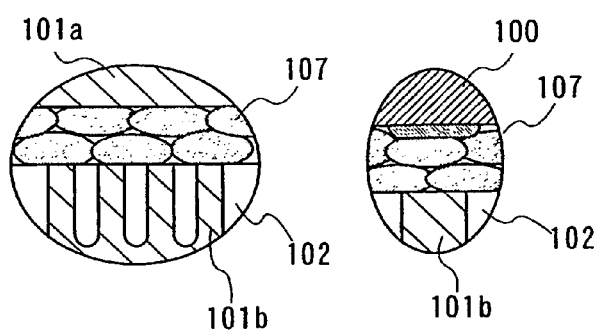

FILM-LIKE ARTICLE AND METHOD FOR MANUFACTURING THE SAME

TECHNICAL FIELD

The present invention relates to a film-like article including a thin film integrated circuit for saving the trouble of inputting information or for avoiding input errors. Further, the invention relates to a method for manufacturing the film-like article.

BACKGROUND ART

In recent years, the chances of seeing products equipped with chips formed from silicon wafers are increased. Using the chips formed from silicon wafers, a variety of information can be stored and provided for consumers.

Further, the chips formed from silicon wafers do not require manual input of information; therefore, it is expected to save the trouble of input and avoid input errors. For example, a business card including a contactless IC tag providing a memory function for storing information in the business card is proposed. With the business card, in the case where the information is required to be transmitted, the telephone number of the party is not misread and the information is correctly transmitted without misdialing, using simple system configurations (Reference 1: Japanese Patent Laid-Open No. 2002-183693).

DISCLOSURE OF INVENTION

However, in the Reference 1, since the chip formed from a silicon wafer is thick, the chip is protruded from the surface or the chip is so large that it can be seen through the eyes, which affects the design of a business card.

Hence, it is an object of the present invention to provide a new integrated circuit which has a structure by which the design is not affected and a film-like article including the integrated circuit unlike a chip formed form a silicon wafer, for example, a business card, a card, or a publication.

In view of the above problems, it is a feature of the invention to equip a film-like article such as a business card, a card, or a publication with a thin film integrated circuit (hereinafter also referred to as an IDF chip). It is another feature of the invention that the IDF chip has a semiconductor film of 0.2 μm or less, generally, 40 nm to 170 nm, and preferably 50 nm to 150 nm as an active region. Therefore, the IDF chip can be made thinner as compared with a chip formed from a silicon wafer.

The IDF chip according to the invention is extremely thin, so that it can be interposed between members of a film-like article and incorporated inside the article. As a result, the design of the film-like article is not affected.

The film-like article includes thin articles such as a business card, a card, and a publication. As a material of the film-like article, an organic material such as acrylic resin such as polypropylene, polyethylene, polystyrene, polycarbonate, polyethylene terephthalate (PET), polyethylene naphthalate (PEN), polyethersulfone (PES), polymethacrylate, ABS; a chemical pulp such as kraft pulp; a mechanical pulp; a pulp obtained from a non-wood material such as hemp or kenaf; or a paper material such as waste paper pulp or synthetic pulp is used.

It is a feature of the invention that the IDF chip transmits light, unlike a chip formed form a silicon wafer. Therefore, the IDF chip may be pasted on a surface of the film-like article, or may be provided in a depression of the article or the like. Although the IDF chip is mounted on the surface or the like of an article, the design of the article is not affected since the IDF chip is thin and transmits light.

More preferably, a semiconductor film included in the IDF chip is formed so as to be interposed between an insulating film such as a silicon film containing nitrogen and a resin. Since a film-like article such as a business card is often touched by hands, it is feared that an alkali metal such as Na enters the semiconductor film. Hence, it is expected that the entering of an alkali metal such as Na is avoided by covering the article with an insulating film and/or a resin.

A specific structure of the invention will be shown below.

A film-like article according to the invention includes a thin film integrated circuit, and the thin film integrated circuit is mounted inside the film-like article.

A film-like article according to the invention includes a thin film integrated circuit which can store information described on the film-like article, and the thin film integrated circuit is mounted inside the film-like article.

A film-like article according to the invention includes a thin film integrated circuit which can store information described on the film-like article and an antenna connected to the thin film integrated circuit. The thin film integrated circuit and the antenna are mounted inside the film-like article.

A film-like article according to the invention includes a thin film integrated circuit which can store information described on the film-like article and an antenna connected to the thin film integrated circuit. The thin film integrated circuit is mounted inside the film-like article, and the antenna is mounted on a surface of the film-like article.

As to a film-like article according to the invention, when the thickness of the film-like article is D, the position to dispose the thin film integrated circuit X may be set so as to satisfy $(\frac{1}{2})\cdot D - 30 \, \mu m < X < (\frac{1}{2})\cdot D + 30 \, \mu m$.

A film-like article including according to the invention includes a thin film integrated circuit which can store information described on the film-like article and an antenna connected to the thin film integrated circuit. The thin film integrated circuit and the antenna are mounted on a surface of the film-like article.

A film-like article according to the invention includes a thin film integrated circuit which can store information described on the film-like article and an antenna connected to the thin film integrated circuit. The thin film integrated circuit is mounted on a surface of the film-like article, and the antenna is mounted inside the film-like article.

A film-like article according to the invention includes a thin film integrated circuit which can store information described on the film-like article. The film-like article is provided with a depression, and the thin film integrated circuit includes an antenna.

The information described on a film-like article is the information marked on the film-like article, for example, characters, marks, and symbols which are printed. The printed characters, marks, and symbols may have color. Alternatively, the information may be the information acquired by senses, such as sound, touch, shape of unevenness or the like.

As to a film-like article according to the invention, an opening with slits is provided in a connection area between the thin film integrated circuit and the antenna.

As to a film-like article according to the invention, the thin film integrated circuit and the antenna are connected by an anisotropic conductor, an ultrasonic bond, or a UV curable resin.

As to a film-like article according to the invention, the thin film integrated circuit has light-transmitting characteristic.

As to a film-like article according to the invention, the thin film integrated circuit has an insulating film containing nitrogen.

As to a film-like article according to the invention, the thickness of the thin film integrated circuit is in a range of 0.1 µm to 3 µm.

As to a film-like article according to the invention, the area of the thin film integrated circuit is 25 mm$^2$ or less.

As to a film-like article according to the invention, the thin film integrated circuit has a semiconductor film containing hydrogen of $1\times10^{19}$ atoms/cm$^3$ to $5\times10^{20}$ atoms/cm$^3$.

As to a film-like article according to the invention, the thickness of the semiconductor film is 0.2 µm or less.

As to a film-like article according to the invention, the semiconductor film includes a source, a drain, and a channel region; and source, the drain, and the channel region are provided perpendicular to direction of bending the film-like article.

As to a film-like article according to the invention, a plurality of thin film integrated circuits are mounted.

As to a film-like article according to the invention, a plurality of thin film integrated circuits are mounted, and the plurality of thin film integrated circuits are integrated with antennas.

In a method for manufacturing a film-like article according to the invention, a plurality of thin film integrated circuits are formed over a first substrate; the plurality of thin film integrated circuits are transferred to a second substrate; the second substrate is cut so as to cut out each of the plurality of thin film integrated circuits; an antenna is connected to a connection terminal of the thin film integrated circuits; and the thin film integrated circuits and the antenna are enfolded in a base member of the film-like article. More preferably, the thin film integrated circuits may be enfolded in the base member of the film-like article without the second substrate.

In a method for manufacturing a film-like article according to the invention, a plurality of thin film integrated circuits are formed over a first substrate; the plurality of thin film integrated circuits are transferred to a second substrate; the second substrate is cut so as to cut out each of the plurality of thin film integrated circuits; an antenna is connected to a connection terminal of the thin film integrated circuits; and the thin film integrated circuits and the antenna are mounted on a surface of a base member of the film-like article. More preferably, the thin film integrated circuits may be mounted on the surface of the base member of the film-like article without the second substrate.

In a method for manufacturing a film-like article according to the invention, a plurality of thin film integrated circuits are formed over a first substrate; the plurality of thin film integrated circuits are transferred to a second substrate; the second substrate is cut so as to cut out each of the plurality of thin film integrated circuits; an antenna is connected to a connection terminal of the thin film integrated circuits; and the thin film integrated circuits and the antenna are mounted in a depression on a surface of a base member of the film-like article. More preferably, the thin film integrated circuits may be mounted in the depression on the base member of the film-like article without the second substrate.

In a method for manufacturing a film-like article according to the invention, a plurality of thin film integrated circuits are formed over a first substrate; the plurality of thin film integrated circuits are transferred to a second substrate; the second substrate is cut so as to cut out each of the plurality of thin film integrated circuits; the thin film integrated circuits are enfolded in a base member of the film-like article, and an antenna is formed on a surface of the base member of the film-like article so that the thin film integrated circuit and the antenna are connected through an opening formed on the base member of the film-like article. More preferably, the thin film integrated circuits may be enfolded in the base member of the film-like article without the second substrate.

In a method for manufacturing a film-like article according to the invention, an antenna is formed on a surface of a base member of the film-like article so that thin film integrated circuits and the antenna are connected through an opening formed on the base member of the film-like article. The plurality of thin film integrated circuits are formed over a first substrate, and transferred to a second substrate. The second substrate is cut so as to cut out the plurality of thin film integrated circuits.

In a method for manufacturing a film-like article according to the invention, the antenna and the thin film integrated circuit are connected by an anisotropic conductor, an ultrasonic bond, or a UV curable resin.

In a method for manufacturing a film-like article according to the invention, the second substrate contains polyethylene terephthalate, polyethylene naphthalate, polyethersulfone, or acrylic.

In a method for manufacturing a film-like article, according to the invention, the antenna is formed by one selected from the group consisting of a droplet discharge method, sputtering, printing, plating, photolithography, and vapor deposition using a metal mask; or a combination thereof.

Since an IDF chip according to the invention is thin and transmits light, the design of the article is not affected even when the IDF chip is mounted on a film-like article, for example, a business card or a card. In addition, the IDF chip according to the invention is lightweight and flexible, so that the endurance of the IDF chip can be enhanced. Thus, the IDF chip can be mounted on a business card or a card without affecting the design.

Further, security can be enhanced with the use of such an IDF chip. Naturally, information management becomes convenient by equipping a business card or a card with the IDF chip. Still further, errors caused by manual input are eliminated and information can be exchanged in a short time. Thus, the convenience of a business card, a card, or the like can be enhanced with the use of the IDF chip.

BRIEF DESCRIPTION OF DRAWINGS

FIGS. 1A to 1D show manufacturing steps of a business card equipped with an IDF chip.

BEST MODE FOR CARRYING OUT THE INVENTION

Figure 2A:
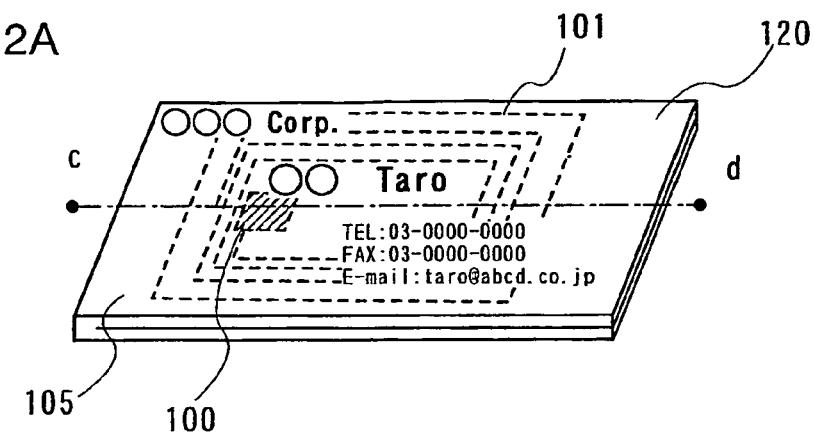
FIGS. 2A and 2B show manufacturing steps of a business card equipped with an IDF chip.

Hereinafter, embodiment modes of the present invention will be described referring to the drawings. It is easily understood by those skilled in the art that the invention is not limited by the following descriptions, and various changes may be made in forms and details without departing from the spirit and the scope of the invention. Therefore, the invention should not be limited by the descriptions of the embodiment modes below. In all drawings for explaining the embodiment modes, the same reference numerals are commonly given to the same parts or to the parts having similar functions, and the descriptions thereof will not be repeated.

Most of embodiment modes below will be each explained using a business card as a film-like article; however, the invention is not limited thereto.

Embodiment Mode 1

In this embodiment mode, the structure of a business card equipped with an IDF chip and a method for mounting the IDF chip to the business card will be described. Further, in this embodiment mode, the case of mounting a contactless IDF chip on a business card will be described. A contactless IDF chip is also referred to as a radio chip.

As shown in FIG. 1A, an antenna substrate 102 provided with an IDF chip 100 and an antenna 101 is prepared. The IDF chip is formed on a glass substrate and transferred to the antenna substrate 102 after a subsequent peel-off process. Alternatively, after the peel-off process, the IDF chip may be transferred to a flexible substrate and mounted thereafter on the antenna substrate 102. The details on the steps for forming the antenna and the peel-off process will be described later.

In this embodiment mode, the antennas are formed separately from the IDF chip; however, the antennas may be formed integrally with the IDF chip. In the case where distance of transmission is as short as several tens of cm, the antennas can be formed integrally with the IDF chip. The case of the integral formation will be described later.

The IDF chip has a semiconductor film with a thickness of 0.2 μm or less as an active region; therefore, the IDF chip can be made thinner as compared with a chip formed from a silicon wafer. The total thickness including the thickness of the semiconductor film can be 5 μm or less, preferably, 0.1 μm to 0.3 μm. Further, since the IDF chip can be transferred to a product itself, or transferred to a flexible substrate, it can be made lighter as compared with a chip formed form a silicon wafer. The design of a film-like article such as a business card is not spoiled with the use of such an IDF chip.

Further, the semiconductor film included in the IDF chip preferably contains hydrogen of $1 \times 10^{19}$ atoms/cm$^3$ to $5 \times 10^{20}$ atoms/cm$^3$ unlike a chip formed from a silicon wafer. The hydrogen will have an effect of alleviating a defect, in other words, terminating a dangling bond. In addition, the flexibility of the IDF chip can be improved by hydrogen. As a result, the IDF chip can be prevented from breaking even in the case of being mounted on a flexible film-like article such as a business card. Alternatively, halogen may be added instead of hydrogen.

FIG. 1B shows a cross-sectional view taken along line a-b of the antenna substrate 102. The IDF chip 100 is provided on one surface 102a of the antenna substrate, and the antennas 101a, 101b are provided on the one surface 102a of the antenna substrate 102 and on the other surface 102b thereof.

FIGS. 1C and 1D each show an enlarged view of a crossing area of antennas and a connection area of the antenna and the IDF chip.

The left figure of FIG. 1C shows an area where antennas provided on both surfaces of the antenna substrate 102 are crossed. An insulator is required to be interposed between the crossed antennas to avoid short circuit. In this embodiment mode, the insulating characteristic of the antenna substrate 102 is used. The antennas are provided on the both surfaces of the antenna substrate 102, and are connected together through an opening of the antenna substrate. For example, the opening may be provided by slitting the antenna substrate 102. (Such an opening is hereinafter referred as an opening with slits). In this case, the material of an antenna 101b provided on the other surface 102b is pushed out, so that the antenna 101b is connected to an antenna 101a provided on the one surface 102a. By providing the opening with slits, unnecessary antenna material is not pushed out, unnecessary pressure is not applied, and the antenna 101a can be prevented from peeling off. Note that the opening is not limited to the structure with slits.

The right figure of FIG. 1C shows an area where the antenna 101b is connected with the IDF chip 100 with the antenna substrate 102 therebetween. As with the crossing area of the antennas, the material of the antenna 101b is pushed out from the opening provided in the antenna substrate antenna substrate 102, so that the antenna 101b is connected to a connection wiring of the IDF chip. The opening may be provided with slits similarly to the crossing area of the antennas. On this occasion, a conductor bump 106 may be provided as a portion to be a connection terminal (hereinafter referred to as a connection terminal) in order to make connection more easily.

FIG. 1D shows an example of connection using a different means from FIG. 1C.

The left figure of FIG. 1D shows an area where antennas provided on both surfaces of the antenna substrate 102 are crossed, and an opening with slits is provided as in the left figure of FIG. 1C. However, the structure in which an anisotropic conductor including a conductor 107 is used as the means for connecting the antenna 101a to the antenna 101b is different.

The right figure of FIG. 1D shows an area where the IDF chip and the antenna are connected, and an opening is provided as in the right figure of FIG. 1C. However, the structure in which an anisotropic conductor including a conductor 107 as the means for connecting the antenna and the IDF chip is different.

The anisotropic conductor may be provided selectively over the connection area, or may be provided over the entirely over the antenna substrate 102. Even in the case of providing the anisotropic conductor entirely, the conductor 107 is pressed at the connection area; thus, the antennas, or the antenna and the IDF chip are connected. Consequently, short circuit between antennas which are not required to be connected are not connected.

In this embodiment mode, the case of forming antennas on both surfaces of the antenna substrate is described. Alternatively, an insulating film may be formed over an antenna provided on one surface, an antenna may be provided on the insulating film, and connection between the antennas may be made through a contact hole.

Such an antenna substrate is enfolded in a base member 105 of a business card; thus, the business card is equipped with the IDF chip.

Subsequently, as shown in FIG. 2A, predetermined description is printed on a surface of a business card 120. Thus, a business card equipped with an IDF chip is completed.

Figure 2B:
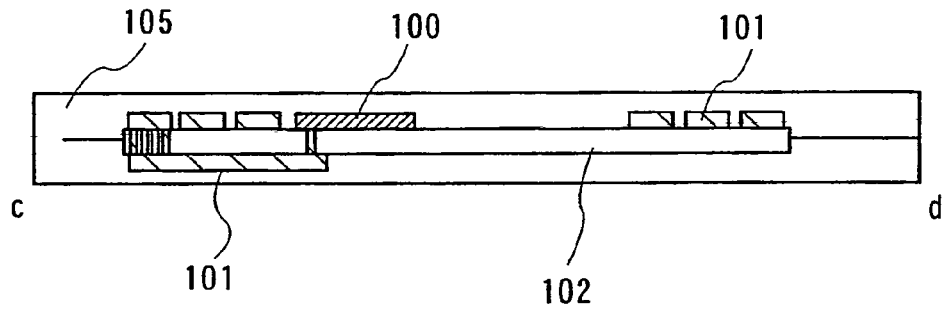

FIG. 2B shows a cross-sectional view taken along line c-d of the business card 120.

By thus enfolding an IDF chip, bond areas, specifically, ends to be bonded can be reduced to three sides. Further, the strength of the business card, that is, durability thereof can be improved.

In this embodiment mode, an example of implementing the IDF chip by enfolding it is explained; however, the IDF chip may be sandwiched between two sheet-like substrates to implement. In this case, ends of 4 sides are required to be bonded.

The bond areas may not be limited to the ends but the bond area may be increased by providing an opening in the antenna substrate 102.

Figure 3:
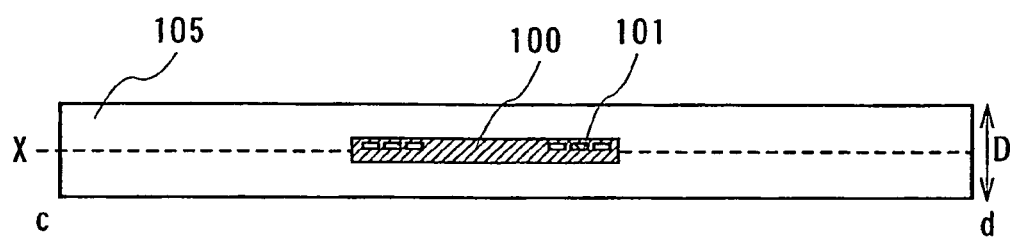
FIG. 3 shows a cross-sectional view of a business card equipped with an IDF chip.

As shown in FIG. 3, an IDF chip 100 integrated with the antennas 101 may be implemented. The IDF chip is formed so that the periphery thereof is covered with the base member 105 of the business card, and the IDF chip may be provided in the middle of the business card. Consequently, the mechanical strength of the IDF chip can be enhanced. Specifically, when the thickness of the business card is D, the position to interpose the IDF chip (the center of the IDF chip): X may be preferably set as $(½)·D-30$ μm$<X<(½)·D+30$ μm. The positional condition is preferably satisfied even in the case where the antennas are formed separately.

As in the embodiment mode above, the durability of an IDF chip and a business card can be improved by covering the IDF chip with a base member of the IDF chip, in other words, by installing the IDF chip inside the business card.

The information inputted in an IDF chip can include information about prints on a business card, information about a company such as a homepage address, or an advertisement of the company. In particular, in the case of dealing with information such as a telephone number or an E-mail address; the mail address of a person who receives the business card may be automatically inputted to, for example, an E-mail soft when the person accesses. As a result, an input error due to manual operation can be avoided.

In this embodiment mode, an example of implementing a contactless IDF chip is described; however, a contact IDF chip or a hybrid IDF chip may be implemented instead.

Embodiment Mode 2

As disclosed in the above Reference 1, since a chip formed from a silicon wafer is not transparent, the chip has been mounted on the back surface of a business card, that is, a surface without print. In contrast, an IDF chip according to the invention transmits light; thus, the IDF chip may be mounted on the surface, that is, a surface with prints. Correspondingly, in this embodiment mode, the case of attaching the IDF chip onto the surface of the business card unlike in the above embodiment mode will be described.

Figure 4A:
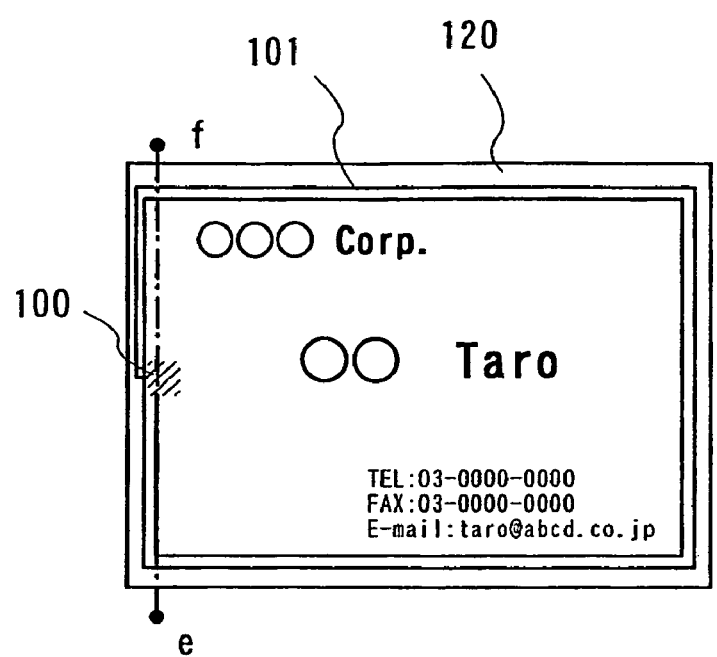
FIGS. 4A and 4B each show a business card equipped with an IDF chip.
Figure 4B:
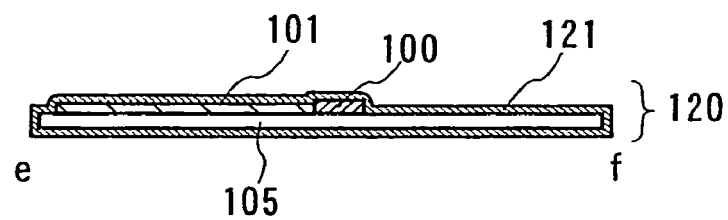

FIG. 4A shows a business card equipped with an IDF chip 100 and an antenna 101 on its surface. FIG. 4B shows a cross-sectional view taken along line e-f. The structures and the manufacturing steps of the IDF chip and the antenna will be described later.

The IDF chip transmits light; meanwhile, the antenna is generally formed of metal, which does not transmit light. Therefore, the antenna may be formed at ends of the business card, that is, the periphery of the business card. If the antenna can be formed of a light transmitting metal material such as ITO (indium tin oxide), IZO (indium zinc oxide) in which 2% to 20% zinc oxide (ZnO) is mixed into indium oxide, or ITO-SiO$_x$ (referred to as ITSO for convenience) in which 2% to 20% silicon oxide (SiO$_2$) is mixed into indium oxide, the antenna does not interfere with prints.

Alternatively, the appearance of the business card may be improved using the non-light transmitting characteristic of the antenna to advantage. In other words, the antenna may be formed so as to decorate the business card.

After thus implementing an IDF chip, the whole business card is laminated with a resin 121, thereby improving the durability of the IDF chip and the business card. Further, in the case where impurities are feared to enter the IDF chip, a resin or the like may be formed so as to cover at least the IDF chip.

Naturally, the IDF chip or the antenna may be mounted on the back surface, that is, the surface without prints.

In this embodiment mode, the case of implementing a contactless IDF chip is described; however, a contact IDF chip, or a hybrid IDF chip may be implemented instead.

Embodiment Mode 3

In this embodiment mode, unlike in the above embodiment mode, a mode of a business card in which an IDF chip is equipped in a depression.

Figure 5A:
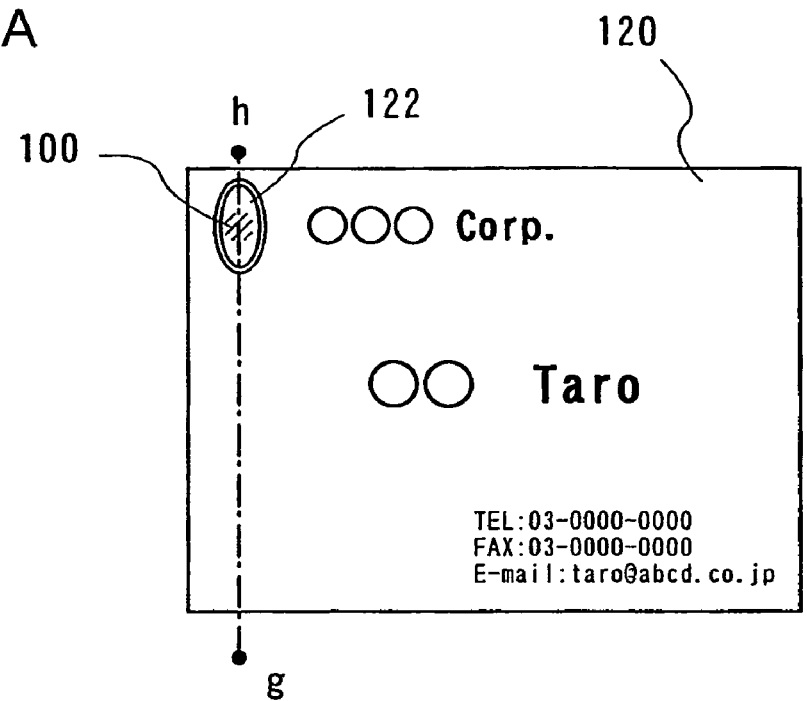
FIGS. 5A and 5B each show a business card equipped with an IDF chip.
Figure 5B:
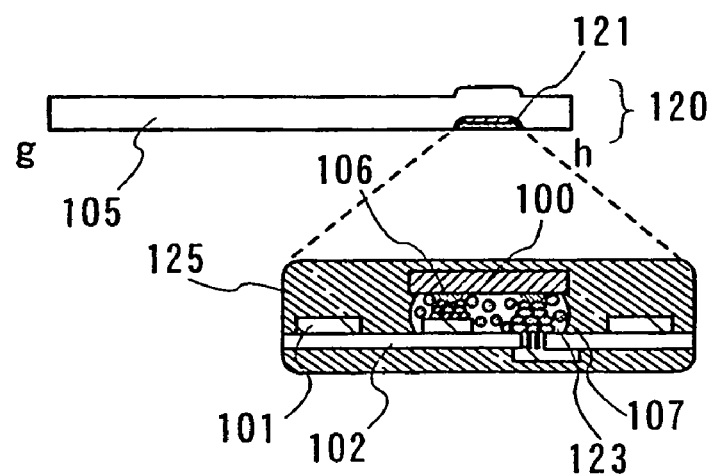

FIG. 5A shows a business card 120 including an IDF chip 100 integrated with an antenna in a depression 122. The IDF chip integrated with the antenna can be also formed to 5 mm square (25 mm$^2$) or less, preferably, 0.3 mm square (0.09 mm$^2$) to 4 mm square (16 mm$^2$), so that the IDF chip can be mounted on the depression provided as decoration on the business card. Further, FIG. 5B shows a cross-sectional view taken along line g-h. The structures and the manufacturing steps of the IDF chip and the antenna will be described later.

The IDF chip 100 integrated with the antenna have a structure in which an antenna 101 formed on an antenna substrate 102 and the IDF chip 100 are connected with a conductor 107 of an anisotropic conductor 123. A resin 125 and the like are provided to cover at least the IDF chip. With the use of the resin, the durability of the IDF chip can be improved, breakage in the case of implementation can be avoided, or portability can be improved.

In the case of thus forming a depression, an IDF chip integrated with an antenna is preferable; however, an antenna may be formed separately as in the above embodiment mode.

After thus implementing the IDF chip, the IDF chip may be covered with the resin 121 to improve the planarity of the depression. The durability of the IDF chip can be improved, and the entry of impurities can be prevented with the use of the resin. Further, the whole business card may be laminated to improve the durability.

In this embodiment mode, an example of implementing a contactless IDF chip is described; however, a contact IDF chip or a hybrid IDF chip may be implemented instead.

Embodiment Mode 4

In this embodiment mode, a mode of a business card unlike in the above embodiment mode will be described.

Figure 6A:
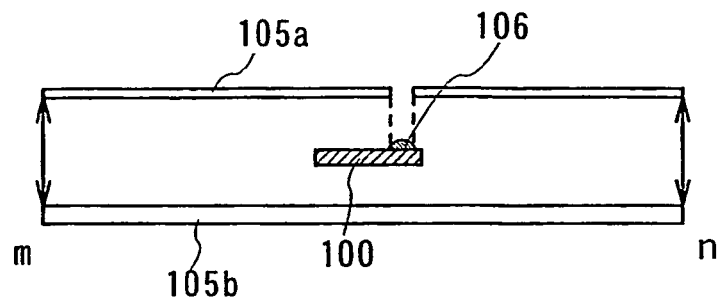
FIGS. 6A to 6C each show a business card equipped with an IDF chip.

As shown in FIG. 6A, an IDF chip 100 is implemented so as to be interposed between one base member 105*a* and the other base member 105*b*. The structure and the manufacturing steps of the IDF chip will be described later.

Figure 6B:
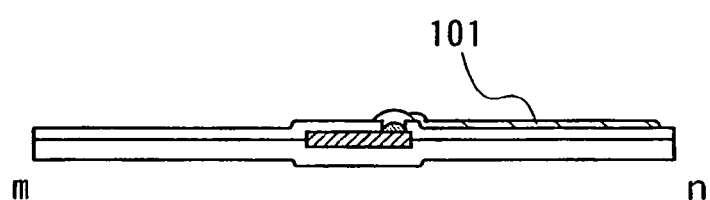

Subsequently, as shown in FIG. 6B, the one base member 105*a* and the other base member 105*b* are bonded. Here, an opening is provided in the one base member, and a conductor bump 106 of the IDF chip and an antenna 101 formed on the surface of the business card can be connected through the opening. Since the antenna generally does not transmit light, the antenna may preferably be formed at ends of the business card, that is, the periphery of the business card. The structure and the manufacturing steps of the antenna will be described later.

Figure 6C:
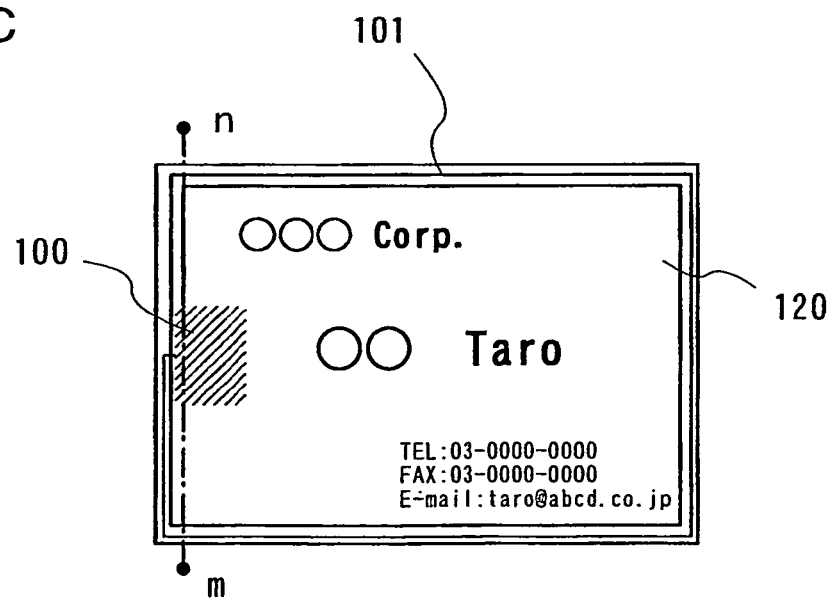

FIG. 6C shows a top view of the business card, and FIGS. 6A and 6B each show a cross-sectional view taken along line m-n.

When an IDF chip and an antenna are formed separately, for example, inside the business card and on the surface thereof, limitations on the mounting position or the size of the IDF chip and the antenna can be eliminated. For example, in the case of implementing an IDF chip including a CPU (central processing unit), the size of the IDF chip would be large. Further, the number of turns is required to be increased. Note that the number of turns is also limited by the transmission distance. In this case, it is feared that the antenna and the IDF chip are difficult to be fittingly mounted on the business card. However, by separating the mounting positions of the antenna and the IDF chip as in this embodiment mode, implementation of an antenna and an IDF chip can be achieved.

In this embodiment mode, an example of implementing a contactless IDF chip is described; however, a contact IDF chip or a hybrid IDF chip may be implemented instead.

Embodiment Mode 5

In this embodiment mode, a mode of a business card unlike in the above embodiment mode will be described.

An IDF chip transmits light since it can be formed on a light-transmitting substrate unlike a chip formed from a silicon wafer. Therefore, the IDF chip does not interfere with the prints of the business card even though the IDF chip is formed on the prints as described above. However, the antenna is formed of metal; accordingly, it has been difficult to transmit light. The problem of resistance or the like also remains in addition to that light-transmitting materials should be further studied. Therefore, in this embodiment mode, a mode where an antenna is implemented in a business card and an IDF chip is mounted on a surface of the business card is proposed.

Figure 7A:
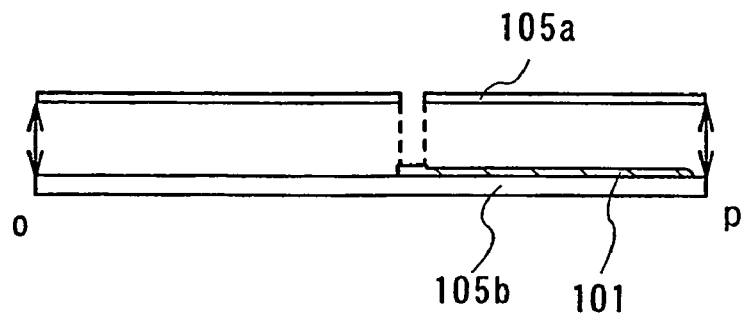
FIGS. 7A to 7C each show a business card equipped with an IDF chip.
Figure 7B:
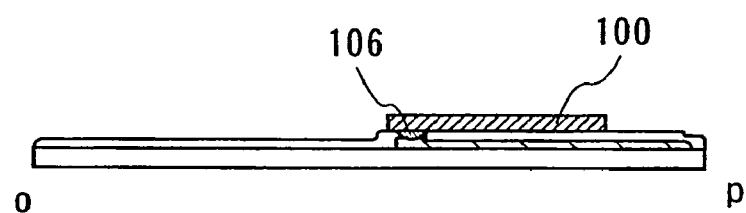

As shown in FIG. 7A, an antenna 101 is formed on the other base member 105b as in the above embodiment mode. The structure and the manufacturing steps of the antenna will be described later. As shown in FIG. 7B, the antenna is interposed between the one base member 105a and the other base member 105b. Here, an opening is provided in the one base member 105a over the terminal area for connecting the antenna to the IDF chip, and the antenna can be connected to a conductor bump 106 of the IDF chip 100. The structure and the manufacturing steps of the IDF chip will be described later.

Figure 7C:
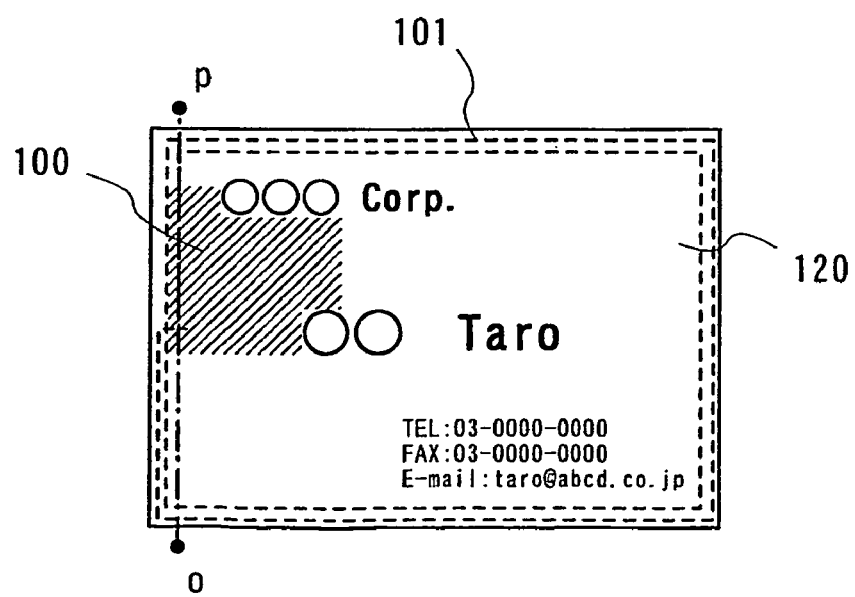

FIG. 7C shows a top view of a business card 120, and FIGS. 7A and 7B each show a cross-sectional view taken along line o-p.

When only a light-transmitting IDF chip is formed on the surface of the business card, limitations on the mounting position or the size of the IDF chip can be eliminated. Since the antenna and the IDF chip are formed in different positions, limitations on the mounting position or the size of the IDF chip and the antenna can be eliminated as in the above embodiment mode. In particular, when the light-transmitting IDF chip is mounted on the surface of the business card, the prints are not affected, which is preferable.

In this embodiment mode, an example of implementing a contactless IDF chip is described; however, a contact IDF chip or a hybrid IDF chip may be implemented instead.

Embodiment Mode 6

In this embodiment mode, a mode of a business card where a plurality of IDF chips are implemented will be described unlike in the above embodiment mode.

Figure 10A:
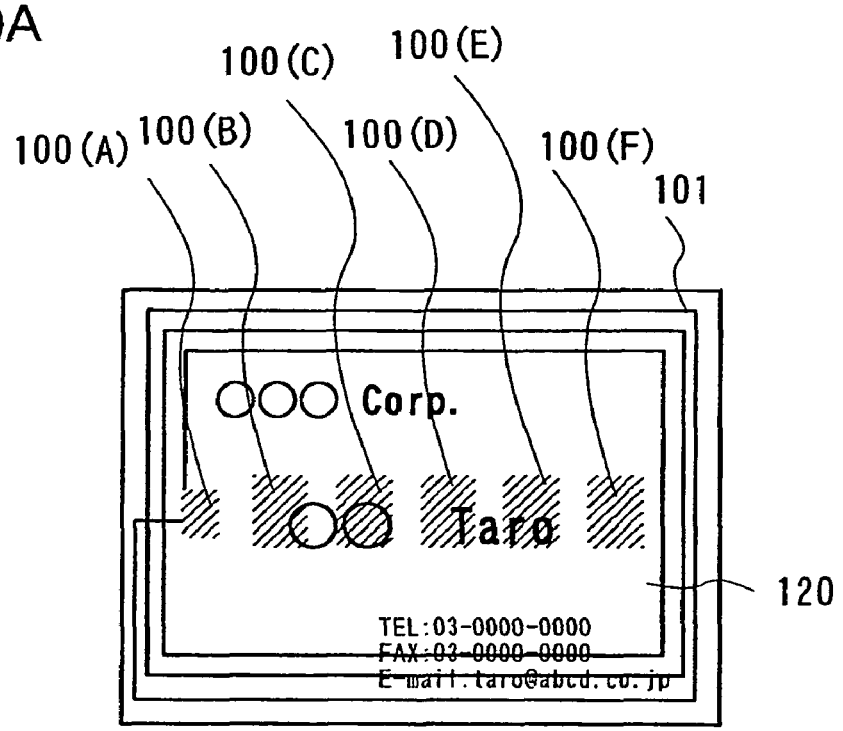
FIGS. 10A and 10B each show a business card equipped with an IDF chip.

As shown in FIG. 10A, six IDF chips of 100 (A), 100 (B), 100 (C), 100 (D), 100 (E), and 100 (F) are mounted on a business card 120. Among the plurality of IDF chips, only the IDF chip 100 (A) is connected with an antenna 101, and the other IDF chips can be integrated with the antenna. The structures and the manufacturing steps of the IDF chip and the antenna will be described later.

When a plurality of IDF chips are implemented, the amount of information inputted into a business card can be increased. Further, unauthorized use of the business card can be avoided; thus, the security can be improved.

For example, interrelation (for example, position or the like) between the respective IDF chips is used to prevent forgery of the IDF chip, so as to improve the security. Alternatively, the forgery can be prevented by randomly arranging the IDF chips.

Further, unless the non-rewritable fixed data of the respective IDF chip accord each other, the information is not disclosed. A semiconductor film or an insulating film may be engraved with serial numbers, or provided with a mask ROM; thus, the fixed data are made non-rewritable.

Figure 10B:
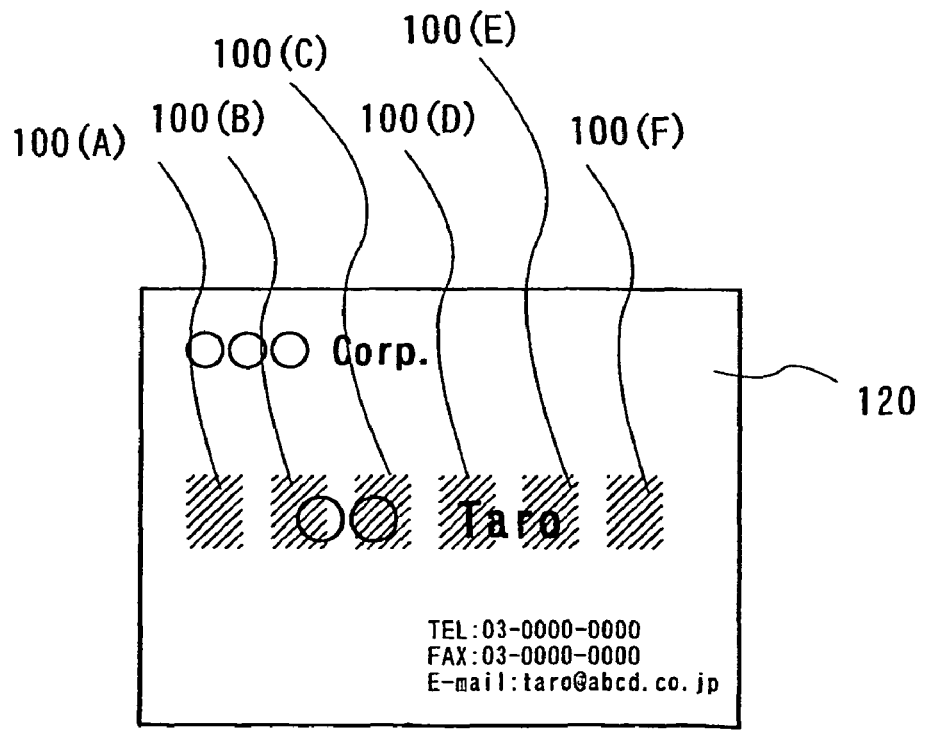

As shown in FIG. 10B, all the IDF chips may be formed integrally with antennas.

Thus, a mode of implementing a plurality of IDF chips is described; however, the amount of information may be increased or the security may be improved with the use of an information storage means such as a bar code and a magnetic tape.

Embodiment Mode 7

In this embodiment mode, the case of forming a plurality of IDF chips from a large substrate will be described referring to FIGS. 8A to 8C. The right figures each show a cross-sectional view taken along line k–1.

Figure 8A:
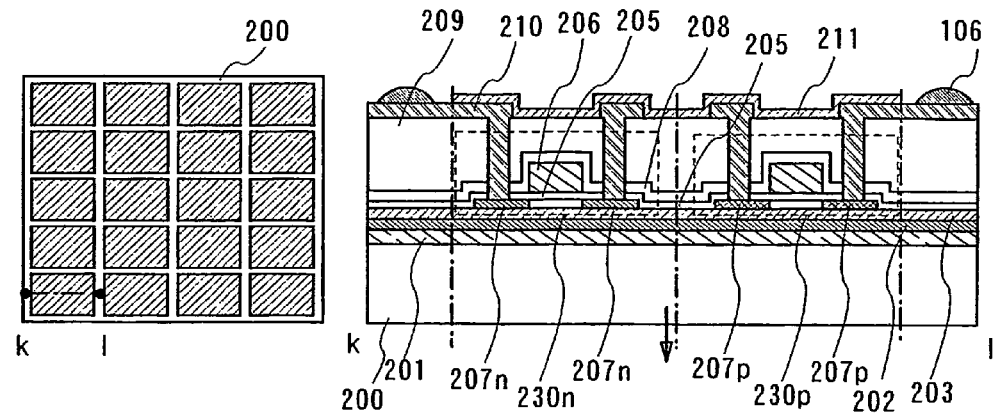
FIGS. 8A to 8C show manufacturing steps of an IDF chip.

As shown in FIG. 8A, a film containing metal (hereinafter referred to as a metal layer) 201 is formed over a substrate 200 having an insulating surface. As the metal, an element selected from W, Ti, Ta, Mo, Nd, Ni, Co, Zr, Zn, Ru, Rh, Pd, Os, and Ir; an alloy material or a compound material containing the element as a main component may be used to form a single layer or a laminate thereof. The metal layer may be formed by, for example, sputtering using a metal target. The metal layer may be formed to 10 nm to 200 nm, preferably, 50 nm to 75 nm.

Instead of the metal layer, a film containing a nitride of the above metal (for example, tungsten nitride or molybdenum nitride) may be used. Further, instead of the metal layer, a film containing an alloy of the above metal (for example, an alloy of W and Mo: $M \times Mo_{1-x}$) may be used. The metal alloy may be formed by sputtering using a plurality of targets such as a first metal (W) and a second metal (Mo) or using a target of an alloy of the first metal (W) and the second metal (Mo) in a film formation chamber. Still further, nitrogen or oxygen may be added to the metal layer. As a method to add, for example, nitrogen or oxygen may be added to the metal layer by ion implantation. Alternatively, the metal layer may be formed in the atmosphere of nitrogen or oxygen in the film formation chamber by sputtering. At this time, a metal nitride may be used as a target.

With the use of such a metal layer, a peel-off process can be controlled. That is, in the case of using a metal alloy, the peel-off process can be controlled by controlling the composition ratio of each metal in the alloy. Specifically, whether the heating treatment is required or not as well as the heating temperature for peeling off can be controlled. Accordingly, the process margin can be increased.

Thereafter, a peel-off layer is formed over the metal layer 201. The peel-off layer includes an oxide film containing silicon as an insulating film 202, and the oxide film also serves as a base film. The peel-off layer may have a single layer structure or a laminated structure. In the case of a laminated structure, an insulating film 203 containing nitrogen, such as a silicon nitride (SiN) film or a silicon oxynitride (SiON or SiNO) film, may be provided so as to prevent impurities or dusts from entering from the metal layer or the substrate. The insulating film containing nitrogen also serves as a base film.

As an oxide film containing silicon, a silicon oxide film, a silicon oxynitride film, or the like may be formed by sputtering or CVD. The oxide film containing silicon is preferably formed to be at least about twice as thick as the metal layer. In this embodiment mode, a silicon oxide film is formed by sputtering using a silicon target to a thickness of 150 nm to 200 nm.

In forming the oxide film containing silicon, an oxide containing the metal (hereinafter, referred to as a metal oxide) is formed on the surface of the metal layer 201. The metal oxide may be formed to a thickness of 0.1 nm to 1 μm, preferably, 0.1 nm to 100 nm, further preferably, 0.1 nm to 5 nm. Thus, the metal oxide is so thin that it would not be observed as a film; accordingly, it is not shown in the figure. As the metal oxide, a thin metal oxide can be also used, which is formed on the surface of the metal layer by treating the metal layer with a solution containing sulfuric acid, hydrochloric acid, or nitric acid; a mixed solution in which hydrogen peroxide solution is mixed with sulfuric acid, hydrochloric acid, or nitric acid; or ozone water. As another method, oxidation may be carried out by plasma treatment in an oxygen atmosphere or by producing ozone by ultraviolet irradiation in the atmosphere containing oxygen. Alternatively, the metal oxide can be formed by heating in a clean oven at a temperature of approximately 200° C. to 350° C.

Next, a semiconductor film, an insulating film serving as a gate insulating film (hereinafter referred to as a gate insulating film) 205, a conductive film serving as a gate electrode (hereinafter referred to as a gate electrode) 206 over an insulating film 203 containing nitrogen; impurity regions 207n and 207p are formed in a semiconductor film using a gate electrode as a mask; an insulating film 208 is formed to cover the gate electrode and the semiconductor film; wirings 210 are formed to connect to the impurity regions; thus, an n-channel thin film transistor 230n and a p-channel thin film transistor 230p are completed. Further, a thin film integrated circuit can be formed from such thin film transistors. The hydrogen concentration can be set $1 \times 10^9$ atoms/cm$^3$ to $5 \times 10^{20}$ atoms/cm$^3$ due to the hydrogen diffusion from the insulating film 208.

The semiconductor film may have an amorphous semiconductor, a semiamorphous semiconductor in which an amorphous state and a crystalline state are mixed (also referred to as a SAS), a microcrystalline semiconductor in which crystal grains of 0.5 nm to 20 nm can be seen in an amorphous semiconductor, or a crystalline semiconductor. Note that the microcrystalline state in which crystal grains of 0.5 nm to 20 nm can be seen is referred to as a micro crystal (μc).

In this embodiment, an amorphous semiconductor film is formed and is crystallized by heat-treatment to form a crystalline semiconductor film. For the heat-treatment, a heating furnace, laser irradiation or irradiation with light emitted from a lamp (hereinafter, referred to as lamp annealing) instead of laser light or a combination thereof can be used.

In the case of laser irradiation, a continuous wave laser (CW laser) and a pulsed laser can be used. One or a plurality of lasers of an Ar laser, a Kr laser, an excimer laser, a YAG laser, a $Y_2O_3$ laser, a YVO$_4$ laser, a YLF laser, a YAlO$_3$ laser, a glass laser, a ruby laser, an alexandrite laser, a Ti: sapphire laser, a copper vapor laser and a gold vapor laser can be used. It is preferable that the beam shape of a laser is linear and the length of a longitudinal axis is 200 μm to 350 μm. Further, the laser beam may have an angle of incidence of θ (0°<θ<90°) on a semiconductor film.

The laser irradiation may be conducted by using laser light of a fundamental wave of a continuous wave laser and laser light of a harmonic of a continuous wave laser, or laser light of a fundamental wave of a continuous wave laser and laser light of a harmonic of a pulsed laser.

In the case of using the pulsed laser being adopted, pulsed laser may be applied with such an oscillation frequency that a semiconductor film is melted by a laser of a pulse and a laser of next pulse is irradiated before solidifying the semiconductor film. This gives that crystal grains that are sequentially grown in the scan direction can be obtained. In other words, the lower limit of the frequency of the pulsed beam may be set, so that the oscillation cycle of the pulsed beam is shorter than the time between melting and solidification of the semiconductor film.

The oscillation frequency of a pulsed beam which is actually used is 10 MHz or more which is much higher than a normally used pulsed beam having an oscillation frequency of a few tens to a few hundreds of Hz.

Laser irradiation may be conducted in an atmosphere of an inert gas such as a rare gas or nitrogen. As a result, surface roughness of a semiconductor due to laser light irradiation can be suppressed, and further, variations of a threshold value due to the variations of the interface state density can be suppressed.

In the case of using a heating furnace for the heat treatment, the amorphous semiconductor film is heat-treated for 2 to 20 hours at a temperature of 500° C. to 550° C. At this time, it is preferable that the temperature is set in multiple-step within the range of 500° C. to 550° C. in such a way that the heating temperature gradually becomes higher. Since hydrogen and the like come out of the amorphous semiconductor film by the initial heat treatment at low temperature, dehydrogenation, which can reduce film unevenness in crystallization, can be carried out. Further, it is preferable that a metal element for promoting crystallization, for example, Ni, is formed over the amorphous semiconductor film, thereby reducing the heating temperature.

However, there is a concern that a metal element adversely affects electric characteristics of a semiconductor element in the case of forming the metal element; thus, it is necessary to conduct a gettering for reducing or removing the metal element. For example, the gettering of the metal element may be conducted to capture the metal element by using the amorphous semiconductor film as a gettering sink.

Alternatively, a crystalline semiconductor film may be formed directly on the surface to be provided therewith. In that case, the crystalline semiconductor film can be formed directly on the surface to be provided therewith by utilizing heat or plasma with the use of fluorine-based gas such as GeF$_4$ or F$_2$ and silane-based gas such as SiH$_4$ or Si$_2$H$_6$.

Such a semiconductor film can be formed to contain hydrogen of $1 \times 10^{19}$ atoms/cm$^3$ to $5 \times 10^{20}$ atoms/cm$^3$ unlike a chip formed from a silicon wafer as described above. The hydrogen will have an effect of alleviating a defect, namely, terminating a dangling bond. In addition, the flexibility of the IDF chip can be improved with hydrogen.

Further, the ratio of the area in an IDF chip, occupied by a patterned semiconductor film is set 5 to % to 30%. Accordingly, the breakage or the peeling of the thin film transistors due to the bending stress can be prevented.

Here, an interlayer insulating film 209 may be formed to improve the planarity. The interlayer insulating film can use an organic material or an inorganic material. As the organic material, polyimide, acryl, polyamide, polyimide amide, benzocyclobutene or resist, siloxane, or polysilazane can be used. Siloxane is formed by using a polymeric material as a starting material, which has a skeleton structure formed by the bond of silicon (Si) and oxygen (O), and which includes at least hydrogen as a substituent, or at least one of fluoride, alkyl group, and aromatic hydrocarbon as the substituent. Polysilazane is formed by using a liquid material including a polymeric material having a bond of silicon (Si) and nitrogen (N) as a start material. As the inorganic material, silicon oxide or silicon nitride can be used.

More preferably, an insulating film 211 containing nitrogen is formed so as to cover the interlayer insulating film and the wirings. Accordingly, the thin film transistors 230 are covered with the insulating films 203 and 211 containing nitrogen. Further, a resin or the like may be used to cover thereover. As a result, impurities can be prevented from entering. In particular, when the IDF chip is mounted on a business card or the like in the state where the IDF chip can be touched by hands, an alkali metal such as Na can be prevented from entering.

Thereafter, a conductor bump 106 is formed as a connection terminal over the interlayer insulating film. The conductor bump can be formed using the same method or material as the antenna.

During or after forming the thin film transistor as described above and after forming the metal oxide, heat treatment is conducted to heat the metal oxide. Consequently, the metal oxide film becomes crystalline. For example, in the case of using tungsten (W) as the metal layer, a metal oxide of $WO_2$ or $WO_3$ is crystallized by heat treatment of 380° C. to 410° C., for example, 400° C. Whether heat treatment is required or not, or the heating temperature may be determined depending on a selected metal layer. Consequently, the metal oxide can be crystallized as necessary and peel-off can be carried out easily.

Further, the heat treatment in manufacturing a semiconductor element can double as the heat treatment for crystallizing the metal oxide. For example, the metal oxide can be crystallized by the heat treatment for a dehydrogenation process for preventing rapid hydrogen release from the semiconductor film. In the case of forming a crystalline semiconductor film, it can be heat-treated by means of a heating furnace or laser irradiation. Consequently, the number of manufacturing steps can be reduced.

Next, the substrate 200 is peeled off. With the use of the support substrate, the substrate can be peeled off easily. Further, it is preferable to form a part where the adhesion is reduced, which may cause peeling off of the substrate easily. For example, a substrate or a support substrate is undercut or the area to be peeled off is marked with a knife from an end surface of a large substrate. Subsequently, the peel-off occurs in the layer of the crystallized metal oxide, or at a boundary (interface) between both surfaces of the metal oxide, that is, at a boundary between the metal oxide and the metal layer or a boundary between the metal oxide and the insulating film 202.

Physical means or chemical means may be used for the peel-off means. As the physical means, stress may be applied against the substrate and the support substrate. As the chemical means, a base substance or a liquid which reacts with a metal layer but does not react with the other area may be used.

Figure 8B:
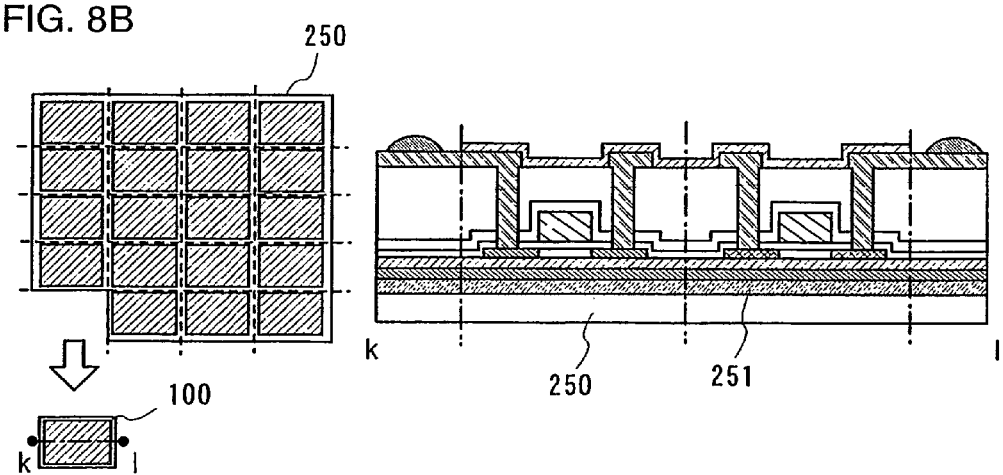

As shown in FIG. 8B, the peel-off layer is transferred to a flexible substrate 250 and attached with an adhesive 251.

Note that to transfer means to move an element (including an element which is formed halfway) formed over a substrate to another substrate. The material of the flexible substrate as described above.

The peel-off layer may be directly transferred to an article to be equipped with an IDF chip. In this case, the flexible substrate can be omitted, which contributes to making the IDF chip thinner and lighter.

As the adhesive, a UV curable resin, specifically, an epoxy resin adhesive or an adhesive of a resin additive, or a double-sided tape may be used.

The glass substrate and the like which occupies the most of the thickness of such a chip is peeled off and the IDF chip which can be transferred to a thin film flexible substrate is used; thus, a business card can be made thinner.

As the substrate is peeled off, there may be the cases where the metal oxide on the thin film transistor side is completely removed, or, where a part or the most part thereof is dotted (remains). When the metal oxide remains, it can be removed by etching or the like. On this occasion, the oxide film containing silicon may also be removed. The improvement in adhesion can be expected if the substrate is transferred to the flexible substrate after removing the remains and/or the oxide film.

After the transfer is finished, the support substrate is peeled off. An adhesive such as a peelable adhesive, for example, a UV peelable adhesive which is removed by UV irradiation, a heat peelable adhesive which is removed by heat, or a water soluble adhesive which is removed by water, or a double sided tape may be used for the adhesive for the substrate to be peeled off.

Thereafter, the large flexible substrate is cut; thus, each IDF chip 100 is cut out.

Figure 8C:
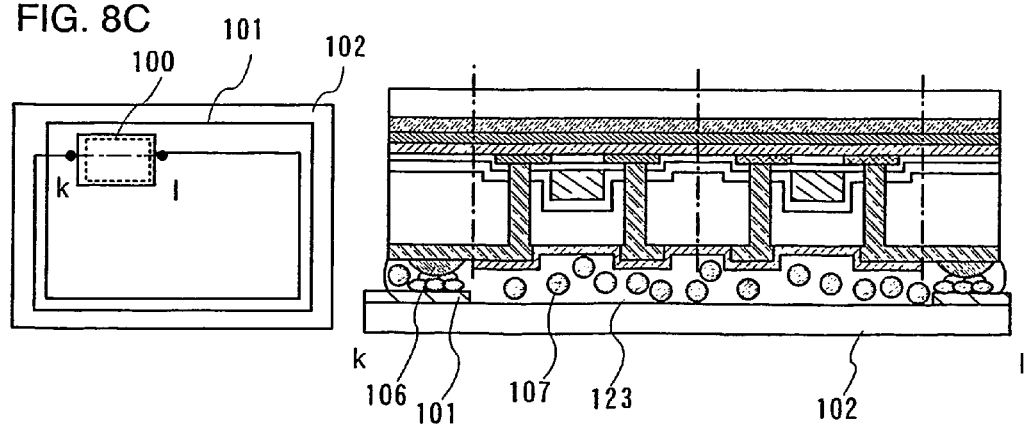

Subsequently, as shown in FIG. 8C, the IDF chip 100 is mounted on an antenna substrate 102 provided with an antenna 101.

As shown in the cross-sectional view, the antenna 101 provided over the antenna substrate, and the conductor bump 106 are connected using the conductor 107 of the anisotropic conductor 123.

As described above, the IDF chip is formed and mounted on the predetermined area.

In this embodiment mode, a peel-off method using a metal layer and the like is described; however, another peel-off method may be employed to peel off the substrate 200. For example, a layer to be separated is irradiated with laser to peel off the substrate 200, or the substrate 200 may be removed by etching. Further, the layer to be separated is undercut; thus, the layer to be separated can be peeled off by an etchant, for example, a fluorine-based etchant, or a chlorine-based etchant such as $ClF_3$.

Alternatively, each IDF chip may be formed without peel-off and transfer. In this case, heat treatment of the thin film transistor and the heat resistance temperature of the substrate 200 need to be considered. For example, in the case of using SAS which can be formed without carrying out heat treatment for the semiconductor film, a flexible substrate which is not highly resistant to heat can be used. A flexible substrate is thin so that it is preferable of an IDF chip. Further, in the case of using a crystalline semiconductor film for a semiconductor film which is crystallized by heating, a glass substrate which is resistant to the heat treatment is required to be used. Since a glass substrate is thick as compared with a flexible substrate; thus, the back surface of the glass substrate may be polished and grinded by chemically and mechanically polishing treatment (typified by CMP: chemical mechanical polishing) in the case of making the glass substrate chip thin. In the case of directly forming a crystalline semiconductor film, a quartz substrate which is resistant to high temperature can be used. The quartz substrate can be similarly made thin by being polished by CMP or the like.

In this embodiment mode, the case where a thin film integrated circuit is mounted in a so-called face-down state where a connection terminal is in the lower portion of the IDF chip is described. However, a thin film integrated circuit may be mounted in a face-up state where a connection terminal is in the upper portion of the IDF chip. In the case of face-up state, wire bonding may be employed for making a contact between a conductive film of the connection terminal portion of the integrated circuit and an antenna and the like.

A mode where a thin film transistor is formed on the substrate 200, the substrate 200 is peeled off and the thin film transistor is transferred is described above. The object where the substrate with the thin film transistor is transferred, which corresponds to the flexible substrate here, and the timing and the number of transfers are not limited to the above mode. For example, as to the timing of transfer, after a metal oxide is formed, the transfer is performed to the flexible substrate immediately after heating, and a thin film transistor may be completed thereafter. In particular, in the case of using a SAS for the semiconductor film, the semiconductor film can be formed at low heating temperature or formed without heat treatment. Accordingly, a thin film transistor can be formed after the transfer to the flexible substrate. Alternatively, the transfer may be performed to a printed substrate or the like other than a surface of an article. For example, in the case of equipping a cellular phone or the like with an IDF chip, the transfer would be performed to a printed substrate. Further, whether the IDF chip is face-up or face-down can be determined depending on the number of peels and transfers.

Since the thus formed IDF chip includes a semiconductor film with a thickness of 0.2 μm or less as an active region, unlike a chip formed from a silicon wafer; good effect of the invention can be utilized even in the case of forming an IDF chip over a glass substrate or a quartz substrate. In order to enhance good effect of an IDF chip, the IDF chip may preferably be formed over a flexible substrate, or transferred as described above.

The IDF chip is provided over a substrate having an insulating surface, or the IDF chip does not include such a substrate itself having an insulating film. Therefore, a signal can be received with high sensitivity without concern for wave absorption, compared with a chip formed from a silicon wafer.

For the substrate having an insulating surface, a substrate made of glass such as barium borosilicate glass or alumino borosilicate glass, a quartz substrate, a stainless substrate or the like can be used. In addition, a substrate made of flexible synthetic resin such as plastic typified by polyethylene terephthalate (PET), polyethylene naphthalate (PEN), polyetersulfone (PES), or acrylic can be used alternatively.

In the case of forming an IDF chip over such a substrate having an insulating substrate, the shape of a mother substrate is not limited as compared with a chip formed from a silicon wafer, where chips are cut out of a circular silicon wafer. Therefore, the productivity of the IDF chip is improved and mass production can be carried out. Consequently, cost reduction of IDF chip can be expected. Although the unit price of an IDF chip is very low, significant profit can be produced by reducing the unit cost.

Preferably, an IDF chip according to the invention is formed over a flexible substrate. Accordingly, the IDF chip is more flexible than a chip formed from a silicon wafer. Further, the IDF chip can be formed to be lighter. A substrate made of flexible synthetic resin such as plastic typified by polyethylene terephthalate (PET), polyethylene naphthalate (PEN), polyetersulfone (PES), or acrylic can be used as the flexible substrate.

Such an IDF which is very thin, light, and flexible is hardly damaged as compared with a chip formed from a silicon wafer.

More preferably, an IDF chip of the invention is mounted on a film-like article in a state where a substrate having an insulating surface and a flexible substrate are removed. In other words, the IDF chip may be directly transferred to the film-like article. In this case, the flexible substrate can be omitted, which contributes to make an IDF chip thinner and lighter. Consequently, the design of the film-like article is not spoiled, which is preferable.

In this embodiment mode, the case of separately forming an IDF chip and an antenna is described; however, peel-off and transfer can also be performed in the case where an IDF chip and an antenna are formed integrally. For example, an antenna is formed in a layer where the wirings 210 are formed, and peel-off and transfer may be performed in that condition.

In this embodiment mode, an example of implementing a contactless IDF chip is described; however, a contact IDF chip or a hybrid IDF chip may be implemented instead.

Embodiment Mode 8

In this embodiment mode, the structure and the formation method of an antenna will be described.

First, the shape and the length of the antenna are described. The number of turns, that is, the length of the antenna, which limits the shape of the antenna, depends on the transmission distance or the wave frequency. Accordingly, the antenna is shaped like a line or a coil. An antenna is coiled in order to secure length. The coiled antenna provided on a surface of an antenna substrate or an article is provided to have a circular or square coil made outward from the center.

Connection terminals are provided at two portions of the antenna. Most of the connection terminals are provided at each end of the antenna. However, the connection terminals may be provided anywhere and the disposition of each connection terminals can be determined in accordance with the connection terminals of the IDF chip. Further, the connection terminals may be provided adjacent to each other or provided separately.

Figure 9A:
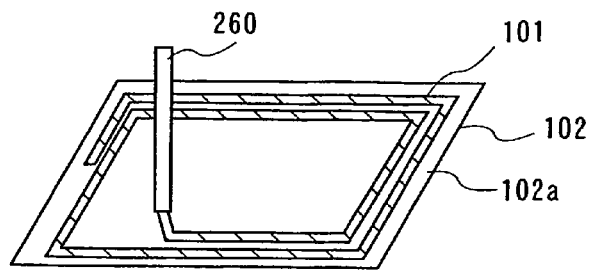
FIGS. 9A to 9C show manufacturing steps of an antenna.
Figure 9B:
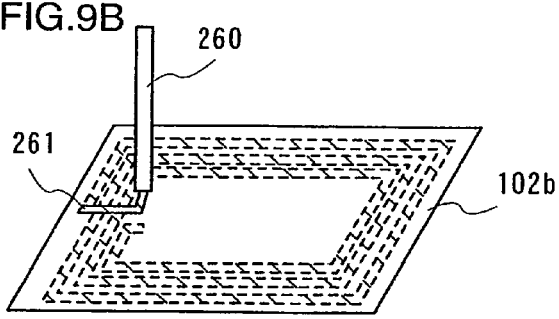
Figure 9C:
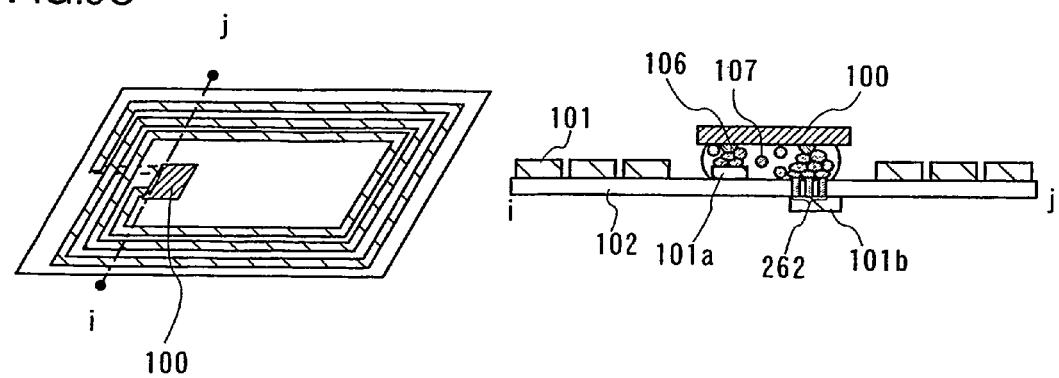

Next, a method for forming an antenna will be described referring to FIGS. 9A to 9C. FIGS. 9A to 9C each show the case where a squarely coiled antenna is formed over an antenna substrate. A substrate made of glass such as barium borosilicate glass or alumino borosilicate glass, a quartz substrate, a substrate made of flexible synthetic resin such as plastic typified by polyethylene terephthalate (PET), polyethylene naphthalate (PEN), polyetersulfone (PES), or acrylic can be used for the antenna substrate. Since it is preferable that the thickness of the antenna substrate is thin, a film-like substrate is preferable.

As shown in FIG. 9A, an antenna is formed by a droplet discharge method on one surface 102a of an antenna substrate 102. The droplet discharge method is a method in which a droplet (also referred to as a dot) of a composition containing a material of such as a conductive film or an insulating film is selectively discharged (sprayed). For example, the droplet discharge method is also called as ink-jet. Other than the droplet discharge method, sputtering, printing, plating, photolithography, or vapor deposition using a metal mask; or a combination thereof may be used to form the antenna. For example, a first antenna is formed by sputtering, a droplet discharge method, printing, photolithography, or vapor deposition; and a second antenna is formed by plating so as to cover the first antenna, thereby forming a laminated antenna. In particular, in the case of forming the antenna by a droplet discharge method or printing, the conductive film need not be patterned; thus, the number of the manufacturing steps can be reduced.

A conductive material such as Ag (silver), Al (aluminum), Au (gold), Cu (copper) or Pt (platinum) can be used as a material of the antenna. In the case of using relatively highly resistant Al or Au, wiring resistance is of concern. However, if the antenna is made thick or area to be provided with the antenna is large, the width of the antenna may be made large thereby reducing the wiring resistance. Alternatively, in the case of using a conductive material having a risk of dispersion, such as Cu, an insulating film serving as a protective film may be formed to cover a surface to be provided with the antenna or to cover the periphery of Cu.

In this embodiment mode, the antenna is formed by discharging Ag mixed in a solvent of tetradecane from a nozzle 260. On this occasion, a base film of titanium oxide (TiOx) is formed to improve the adhesion of Ag.

More preferably, pressure is applied to the formed antenna to improve the planarity. As a result, the antenna can be made thinner. A heating means may be provided as well as a pressure means, and in that case, pressure treatment and heat treatment can be performed at a time. In particular, in the case of using a droplet discharge method, and when heat treatment is necessary for removing the solvent, the heat treatment can double.

Further, a groove may be formed in the antenna substrate and the antenna may be formed in the groove. Since the antenna can be formed inside the groove, the antenna substrate and the antenna can be made thinner.

Subsequently, as shown in FIG. 9B, the rest part of the antenna is formed by droplet discharge method on the other surface 102b of the antenna substrate. The antenna is provided on the other surface since an insulator is required to prevent short circuit between antennas since the antenna is formed to be coiled. Therefore, the part of the antenna can be formed through an opening provided in the insulator.

In this embodiment mode, an opening 262 is formed in the antenna substrate, and the antennas are connected each other through the opening. Further, an opening is formed over the antenna substrate for connecting the antenna formed over the other surface and the IDF chip.

As shown in FIG. 9C, the connection terminal of the antenna and the connection terminal of the IDF chip are connected in order to connect the antenna 101 and the IDF chip 100.

The detailed description will be given referring to a cross-sectional view taken along line i-j of the antenna substrate 102 in the right figure. In the area where the connection terminal of the antenna formed on the other surface is provided, an opening 262 is provided in the antenna substrate. The IDF chip 100 is mounted so as to cover the opening and the connection terminal of the antenna provided on the one surface.

Here, the connection terminal of the IDF chip, that is, the conductor bump 106 and the connection terminal of the antennas 101a and 101b are connected using an anisotropic conductor 123. The anisotropic conductor is a resin in which a conductor 107 is dispersed, which has a bonding function. In the area where the connection terminal is provided, the conductor is crimped due to the thickness of the connection terminal; thus, the conductor makes contact. Other than the area, the conductor is not conductive since sufficient distance is kept.

The opening 262 is filled with the conductor which is conductive. Alternatively, the opening may be filled with an antenna material. In this case, the opening can be filled with the antenna material in forming the antenna on the other surface.

Although not shown, an insulating film containing resin or nitrogen may be used to cover the IDF chip for protection. Further, the insulating film can also prevent impurities from entering a thin film transistor in the IDF chip.

In this embodiment mode, the case where the IDF chip is mounted using an anisotropic conductor in a so-called face-down state where the connection terminal is in the lower portion of the IDF chip is described. Alternatively, wire bonding may be used as the connecting means. Wire bonding is preferable in the case of a so-called face-up state where the connection terminal of the IDF chip is in the upper portion of the IDF chip.

In the figures for describing this embodiment mode, the IDF chip and the antenna substrate are illustrated thick for the sake of clarity; however, they actually have extremely thin shape.

Embodiment Mode 9

An IDF chip has a measure of area and is highly flexible as compared with a chip formed from a silicon wafer; therefore, the damage due to bending stress needs to be considered. Correspondingly, in this embodiment mode, the state where a business card equipped with an IDF chip is bent will be described.

Figure 11A:
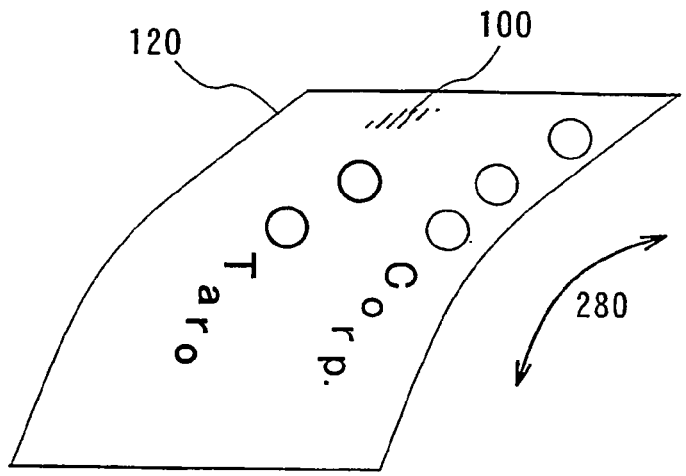
FIGS. 11A to 11C each show the state where a business card equipped with an IDF chip is bent.

FIG. 11A shows a business card 120 which is bent in the direction of the arrow 280. Generally, a thin film material is easily bent or can be bent easily in the longitudinal direction; accordingly, the case of bending in the longitudinal direction will be described in this embodiment mode.

Figure 11B:
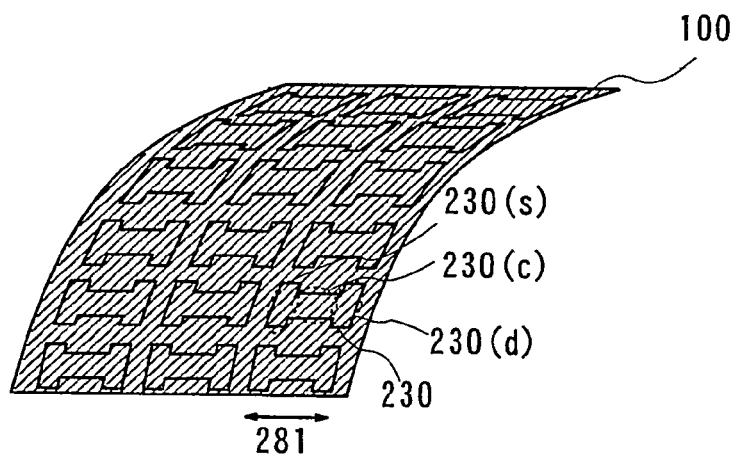

An IDF chip 100 in such a state is shown in FIG. 11B. The IDF chip has a plurality of thin film transistors 230 and the thin film transistors are arranged so that a direction 281 of carrier flow and the direction of the arrow (bending direction) 280 are perpendicular. In other words, a source region 230(s), a channel forming region 230(c), and a drain region 230(d) of each thin film transistor are arranged so as to be perpendicular to the bending direction 280. As a result, the breakage or the peeling of the thin film transistors due to the bending stress can be prevented.

Figure 11C:
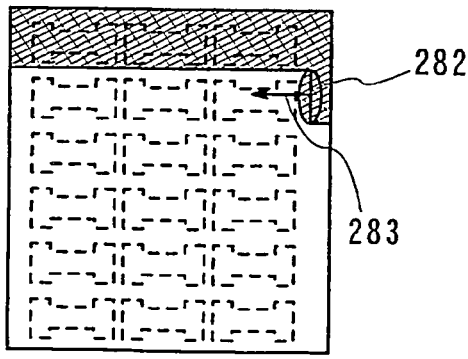

In the case of using a crystalline semiconductor film using laser irradiation as a semiconductor film, laser scanning direction 283 is also set so as to be perpendicular to the bending direction 280. For example, as shown in FIG. 11C, in the case of moving a laser irradiation area (spot) 282 to crystallize the entire surface, the laser scanning direction 283 is set perpendicular to the bending direction 280.

By bending the IDF chip in such a direction, the IDF chip, particularly, a thin film transistor is not damaged. Further, the grain boundaries in the direction of the carrier flow can be reduced to a minimum. Consequently, the electrical characteristics of the thin film transistors, particularly, the mobility can be improved.

In addition, by setting the ratio of the area in an IDF chip, occupied by a patterned semiconductor film is 5% to 30%, the breakage or the peeling of the thin film transistors due to the bending stress can be prevented.

In this embodiment mode, an example of implementing a contactless IDF chip is described; however, a contact IDF chip or a hybrid IDF chip may be implemented instead.

Embodiment Mode 10

Application mode using a business card equipped with such an IDF chip will be described.

Figure 12A:
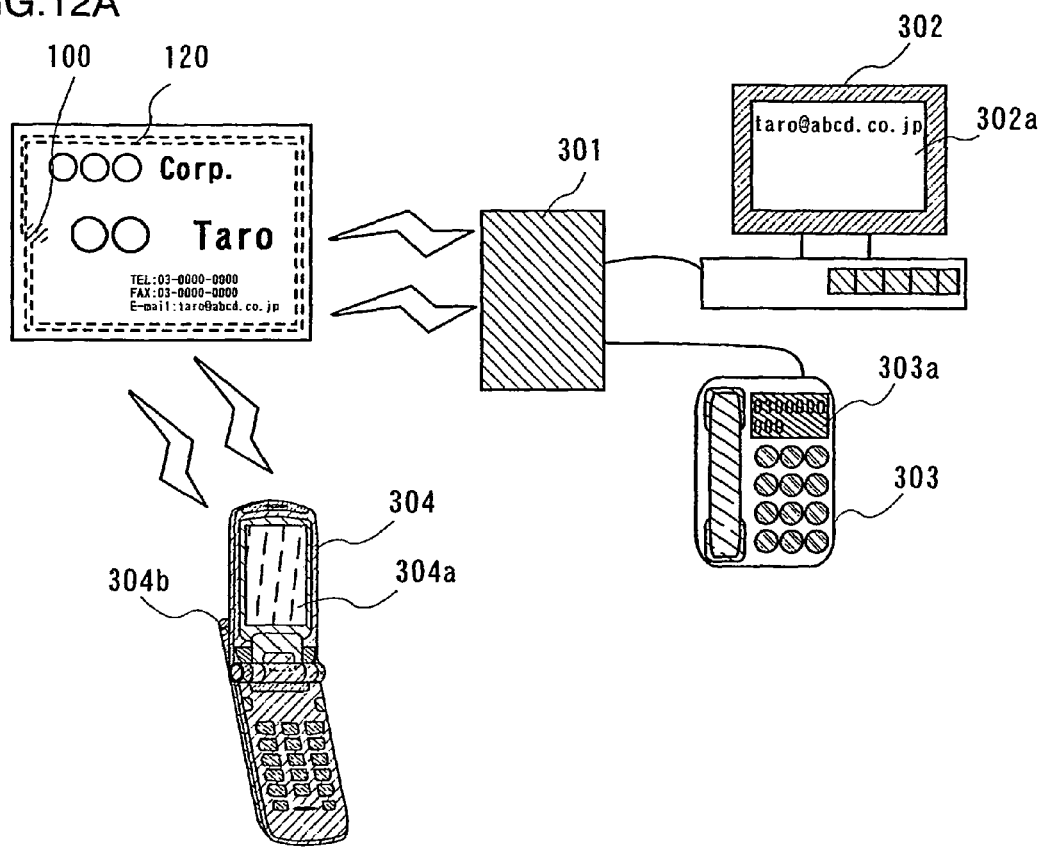
FIGS. 12A and 12B each show a usage mode of a business card equipped with an IDF chip.

FIG. 12A shows information flow through a business card 120 equipped with an IDF chip 100, a reader/writer 301, a personal computer 302, and the like. Information in the IDF chip, particularly, an E-mail address can be inputted into the personal computer through the reader/writer, and the information can be confirmed on a display area 302a. On this occasion, if a mailer software is activated, an E-mail can be sent immediately.

Further, with a business card management software activated, the information in the IDF chip can be inputted through the reader/writer. Thus, business card management which has conventionally taken a lot of time can be made more convenient.

Advertisement information of a company, for example, a home page address may be inputted into a personal computer. On this occasion, an internet software is required to be activated.

Instead of a personal computer, a telephone 303 may be used. In this case, a telephone number recorded in the business card 120 can be inputted to the telephone 303 through the reader/writer 301, and the telephone number can be confirmed on a display area 303a.

In addition, both the personal computer 302 and the telephone 303 can be connected to the reader/writer 301.

The information in the business card can be read with the use of a portable electronic device provided with a function of a reader/writer, typified by a cellular phone 304 or a PDA. For example, a coil serving as an antenna 304b of the cellular phone 304 is designed to serve also as an antenna of a reader/writer. A telephone number and an E-mail address recorded in the business card can be inputted into the cellular phone and the information can be confirmed on a display area 304a.

By reading information recorded in an IDF chip, an input error can be avoided as compared with the case where the information in the business card is inputted manually. Accordingly, a large number of business cards can be managed conveniently.

Figure 12B:
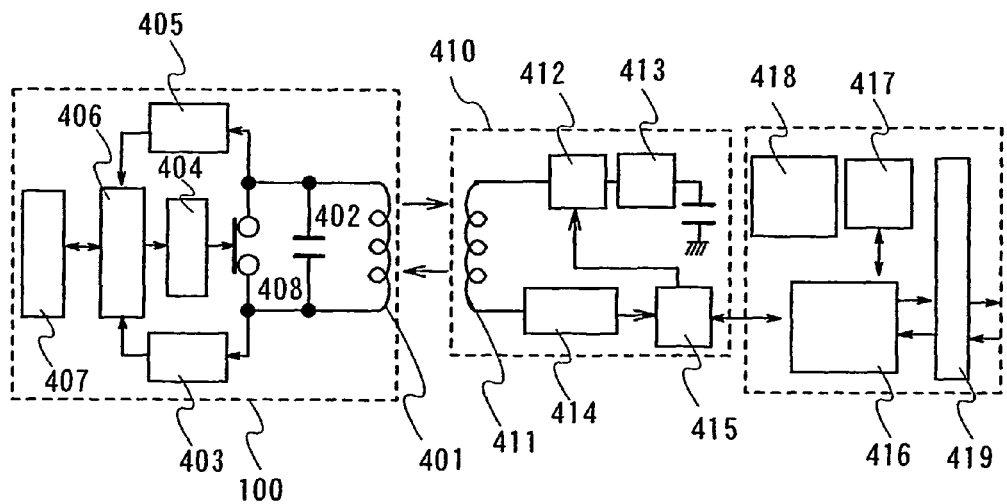

FIG. 12B shows a circuit configuration of an IDF chip and a reader/writer.

First, an IDF chip 100 includes an antenna coil 401, a capacitor 402, a demodulation circuit 403, a modulation circuit 404, a rectifier circuit 405, a microprocessor 406, a memory 407, and a switch 408 for applying a load to the antenna coil 401. These circuits and the microprocessor can be formed with a thin film integrated circuit. The number of the memory 407 is not limited to one but a plurality of memories may be used.

A reader/writer 410 includes an antenna coil 411, a modulation circuit 412, and an oscillating means 413, which contribute to the generation of a transmit signal. The reader/writer 410 further includes a detection demodulation circuit 414 which detects, amplifies, and modulates a received signal. Since a signal received from the IDF chip is extremely weak, the received signal is preferably separated and amplified with the use of a filter or the like. Subsequently, the received signal is transmitted to a gate ASIC (application-specific integrated circuit) 415.

The data inputted to the gate ASIC is transmitted to a microprocessor 416 and processed. As necessary, mutual transmission of a signal is performed between the microprocessor 416 and a memory 417, thereby achieving predetermined processing. A program, data, and the like which are used in the microprocessor 416 are stored in the memory 417. Moreover, the memory can be used as an operation area in processing. Thereafter, signal transmission between the microprocessor and a signal interface 419 can be performed. Further, a power supply 418 for such mutual signal exchange is provided.

Such microprocessor 416, memory 417, and signal interface 419 can be provided in a personal computer or a telephone itself.

Further, an electronic device such as a cellular phone which also serves as a reader/writer includes an antenna coil 411, a modulation circuit 412, an oscillating means 413, a detection demodulation circuit 414, a gate ASIC 415, a microprocessor 416, a memory 417, a power supply 418, and a signal interface 419.

Naturally, the circuits above and the like are formed in a personal computer or a telephone to provide reader/writer function.

A signal transmitted from the gate ASIC 415 as electric waves through the modulation circuit 412 is converted into an AC electrical signal by electromagnetic induction in the antenna coil 401. The AC electrical signal is demodulated in the demodulation circuit 403 and transmitted to the microprocessor 406. Further, power supply voltage is generated with the use of the AC electrical signal in the rectifier circuit 405, and supplied to the microprocessor 406.

In the microprocessor 406, a variety of processing is performed in accordance with inputted signals. The memory 407 can be used not only for storing a program, data and the like used in the microprocessor 406 but also as an operation area in processing. A signal transmitted from the microprocessor 406 to the modulation circuit 404 is modulated into an AC electrical signal. The switch 408 can apply a load to the antenna coil 401 in accordance with the AC electrical signal from the modulation circuit 404. The reader/writer receives the load applied to the antenna coil 401 by electric waves, thereby consequently reading a signal from the microprocessor 406.

The circuit configurations of the IDF chip and the reader/writer shown in FIG. 12B is only an example, and the present invention is not limited thereto. A method for transmitting a signal is not limited to the electromagnetic induction method shown in this embodiment mode. An electromagnetic coupling method, a microwave method, or other transmitting methods may also be adopted. Further, an IDF chip of the present invention may have function of such as GPS.

Embodiment Mode 11

In this embodiment mode, a mode of using a publication, for example a newspaper, which is mounted with an IDF chip, will be described.

An IDF chip including information in a newspaper is mounted on a part of the newspaper. The information in the IDF chip is inputted into a portable electronic device, for example, a cellular phone. On this occasion, the information may be inputted with the use of a dedicated reader/writer, or may be imputed using a reader/writer function of the cellular phone as described above.

Thus, by inputting information to a portable electronic device, the information in a newspaper can be read on a display area without spreading a newspaper in a small vehicle such as a train. For example, information of a novel, a magazine, or the like other than a newspaper can be inputted into a portable electronic device.

Even in the case of implementing an IDF chip in a publication, the IDF chip has advantages that it is thin, lightweight, hardly damaged, and light-transmitting, and the like. Thus, the durability of the IDF chip can be improved, and the design of the publication is not affected.

As described above, by implementing an IDF chip in a publication or the like, information of the contents can be easily computerized, and higher added value and higher function can be acquired.

Thus, IDF chips can be used in various application modes.

The invention claimed is:

1. A film-like article comprising:
a substrate having a groove;
a circuit capable of storing information described on the substrate; and
an antenna in the groove, the antenna being connected to the circuit.

2. A film-like article according to claim 1,
wherein when a thickness of the film-like article is D, a position to dispose the circuit X may be set so as to satisfy $(1/2) \cdot D - 30\ \mu m < X < (1/2) \cdot D + 30\ \mu m$.

3. A film-like article comprising:
a IDF chip;
an antenna connected to the IDF chip through an anisotropic conductor; and
a resin covering the IDF chip and the antenna,
wherein the IDF chip and the antenna are provided in a depression of the film-like article.

4. A film-like article comprising:
a substrate;
a circuit capable of storing information described on the substrate;
a first antenna on a top surface of the substrate; and,
a second antenna on a bottom surface of the substrate,
wherein the first antenna is electrically connected to the second antenna through an opening of the substrate, and
wherein the first antenna and the second antenna are electrically connected to the circuit.

5. A film-like article according claim 1,
wherein the thin film integrated circuit has light-transmitting characteristic.

6. A film-like article according claim 3,
wherein the IDF chip has light-transmitting characteristic.

7. A film-like article according claim 4,
wherein the circuit has light-transmitting characteristic.

8. A film-like article according to claim 1,
wherein the circuit has an insulating film containing nitrogen.

9. A film-like article according to claim 3,
wherein the IDF chip has an insulating film containing nitrogen.

10. A film-like article according to claim 4,
wherein the thin film integrated circuit has an insulating film containing nitrogen.

11. A film-like article according to claim 1,
wherein thickness of the circuit is in a range of 0.1 μm to 3 μm.

12. A film-like article according to claim 3,
wherein thickness of the circuit IDF chip is in a range of 0.1 μm to 3 μm.

13. A film-like article according to claim 4,
wherein thickness of the circuit is in a range of 0.1 μm to 3 μm.

14. A film-like article according to claim 1,
wherein the circuit has a semiconductor film containing hydrogen of $1 \times 10^{19}$ atoms/cm$^3$ to $5 \times 10^{20}$ atoms/cm$^3$.

15. A film-like article according to claim 3,
wherein the circuit IDF chip has a semiconductor film containing hydrogen of $1 \times 10^{19}$ atoms/cm$^3$ to $5 \times 10^{20}$ atoms/cm$^3$.

16. A film-like article according to claim 4,
wherein the circuit has a semiconductor film containing hydrogen of $1 \times 10^{19}$ atoms/cm$^3$ to $5 \times 10^{20}$ atoms/cm$^3$.

17. A film-like article according to any one of claims 14 to 16,
wherein the semiconductor film includes a source, a drain, and a channel region, and
the source, the drain, and the channel region are provided perpendicular to direction of bending the film-like article.

18. A film-like article according to claim 1,
wherein the film-like article comprises a plurality of circuits, and
the plurality of circuits are integrated with antennas.

19. A film-like article according to claim 3,
wherein the film-like article comprises a plurality of IDF chips, and
the plurality of IDF chips are integrated with antennas.

20. A film-like article according to claim 4,
wherein the film-like article comprises a plurality of circuits, and
the plurality of circuits are integrated with antennas.

21. A film-like article according to claim 1,
wherein the film-like article is a business card.

22. A film-like article according to claim 3,
wherein the film-like article is a business card.

23. A film-like article according to claim 4,
wherein the film-like article is a business card.

* * * * *